(12) United States Patent
Chen

(10) Patent No.: US 10,367,101 B2
(45) Date of Patent: Jul. 30, 2019

(54) SCHOTTKY DIODE AND METHOD OF MANUFACTURING THE SAME

(71) Applicant: Gpower Semiconductor, Inc., Suzhou (CN)

(72) Inventor: Hongwei Chen, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 15/967,257

(22) Filed: Apr. 30, 2018

(65) Prior Publication Data

US 2018/0248049 A1    Aug. 30, 2018

Related U.S. Application Data

(63) Continuation of application No. 15/382,562, filed on Dec. 16, 2016, now Pat. No. 9,985,143, which is a (Continued)

(30) Foreign Application Priority Data

Nov. 19, 2014  (CN) .......................... 2014 1 0663922

(51) Int. Cl.
| | |
|---|---|
| *H01L 29/872* | (2006.01) |
| *H01L 29/20* | (2006.01) |
| *H01L 29/205* | (2006.01) |
| *H01L 29/40* | (2006.01) |
| *H01L 29/417* | (2006.01) |

(Continued)

(52) U.S. Cl.
CPC ........ *H01L 29/872* (2013.01); *H01L 29/2003* (2013.01); *H01L 29/205* (2013.01); *H01L 29/402* (2013.01); *H01L 29/404* (2013.01); *H01L 29/407* (2013.01); *H01L 29/417* (2013.01); *H01L 29/66212* (2013.01); *H01L 29/66219* (2013.01); *H01L 29/778* (2013.01)

(58) Field of Classification Search
CPC ............. H01L 29/872; H01L 29/66212; H01L 29/407; H01L 29/778
See application file for complete search history.

(56) References Cited

U.S. PATENT DOCUMENTS

| | | | | |
|---|---|---|---|---|
| 7,449,730 B2 * | 11/2008 | Kuraguchi | .......... | H01L 29/0692 257/199 |
| 9,985,143 B2 * | 5/2018 | Chen | ..................... | H01L 29/872 |

(Continued)

*Primary Examiner* — Quoc D Hoang
(74) *Attorney, Agent, or Firm* — Flener IP & Business Law; Zareefa B. Flener

(57) ABSTRACT

A Schottky diode comprises: a substrate; a first semiconductor layer located on the substrate; a second semiconductor layer located on the first semiconductor layer, two-dimensional electron gas being formed at an interface between the first semiconductor layer and the second semiconductor layer; a cathode located on the second semiconductor layer and forming an ohmic contact with the second semiconductor layer; a first passivation dielectric layer located on the second semiconductor layer; a field plate groove formed in the first passivation dielectric layer; and an anode covering the field plate groove and a portion of the first passivation dielectric layer, wherein a distance between a bottom surface of the field plate groove and the two-dimensional electron gas in a height direction is greater than 5 nm.

20 Claims, 11 Drawing Sheets

Related U.S. Application Data continuation of application No. PCT/CN2015/081501, filed on Jun. 15, 2015.

(51) Int. Cl.
  *H01L 29/66* (2006.01)
  *H01L 29/778* (2006.01)

(56) References Cited

U.S. PATENT DOCUMENTS

2012/0223319 A1* 9/2012 Dora .................. H01L 29/2003
   257/76
2013/0105811 A1* 5/2013 Ando .................. H01L 29/2003
   257/76

* cited by examiner

SCHOTTKY DIODE AND METHOD OF MANUFACTURING THE SAME

CROSS-REFERENCE TO RELATED APPLICATIONS

This application is a continuation application of U.S. patent application Ser. No. 15/382,562, filed on Dec. 16, 2016, which is a continuation of international application No. PCT/CN2015/081501 filed on Jun. 15, 2015. The international application claims the benefit and priority of Chinese patent application No. 201410663922.0, filed on Nov. 19, 2014. The afore-mentioned patent applications are hereby incorporated by reference in their entireties.

TECHNICAL FIELD

The disclosed embodiments relate to semiconductor technology, and more particularly to a Schottky diode and a method of manufacturing the same.

BACKGROUND

In the field of high-voltage switches, it is desirable that a diode has a low reverse leakage current, high reverse voltage and a low forward turn-on voltage drop. Since power electronic devices based on wide bandgap semiconductor materials, particularly gallium nitride materials, have superior characteristics, gallium nitride Schottky diodes have been a hot topic in recent years. Currently, homoepitaxy of gallium nitride on gallium nitride substrates is still in a small-scale, high-cost stage. Although high-quality epitaxial materials and desired device performances can be achieved, such a technology has not been widely used due to high costs.

At present gallium nitride materials are mainly grown on heterogeneous materials, and have relatively high defect densities, e.g., $10^8$ cm$^{-3}$, thus desired performances still cannot be obtained for gallium nitride Schottky diodes having vertical structures. However, High Electron Mobility Devices (HEMTs) based on two-dimensional electron gas channels which have high electron mobility in the horizontal direction and are formed by aluminum gallium nitride/gallium nitride heterojunction structures have been widely used in the fields of RF and power electronics. This is because, on the one hand, gallium nitride is a kind of wide bandgap semiconductor materials which have critical breakdown electric field intensity about 10 times higher than that of silicon materials and thus has a characteristic of high reverse voltage, on the other hand, the two-dimensional electron gas channels can provide very low turn-on resistances so that power loss of the switching devices can be reduced. Therefore, horizontal diodes based on aluminum gallium nitride/gallium nitride heterojunction structures gradually become an important research topic in the industry.

For a Schottky diode formed by direct deposition of Schottky metal on an aluminum gallium nitride/gallium nitride heterojunction structure, a thickness of an aluminum gallium nitride barrier layer between the Schottky metal and the two-dimensional electron gas usually reaches to 20 nm, resulting in a large Schottky barrier thickness. In addition, a relatively large surface state density of the aluminum gallium nitride barrier layer will lead to the Fermi level pinning effect, which also results in a large Schottky barrier thickness. Therefore, the Schottky diode has a high forward knee voltage, e.g. greater than 1 V, which is disadvantageous for reduction of turn-on loss of the diode.

In order to reduce a forward turn-on voltage of the Schottky diode, anode groove structures are proposed. In such structures, an aluminum gallium nitride barrier layer and a portion of a gallium nitride channel layer in an anode region are etched and then deposited with an anode metal, so that the anode metal at sidewalls and the two-dimensional electron gas channel form metal-semiconductor contacts, which eliminates a Schottky barrier thickness formed by the aluminum gallium nitride barrier layer with a thickness of 20 nm and reduces the forward knee voltage, e.g. less than 0.7 V, of the diode. In addition, the two-dimensional electron gas channel having high electron mobility provides a very low turn-on resistance, so that a Schottky diode with high performances such as a low forward turn-on voltage and a low turn-on resistance can be obtained. Furthermore, the two-dimensional electron gas channel has a very low hole concentration due to the wide bandgap characteristic of the gallium nitride material, thus the diode has a very short reverse recovery time. However, the conventional gallium nitride Schottky diodes still have some shortcomings. For example, field-induced thermionic emission or electron tunneling effect in high electric fields will cause an increased reverse leakage current, which reduces the reverse voltage performance of the device.

In order to improve the performances of Schottky diodes, different structures have been proposed in some articles and patents.

For example, in the article "Fast Switching GaN Based Lateral power Schottky Barrier Diode with Low Onset Voltage and Strong Reverse Blocking" (IEEE ELECTRON DEVICE LETTERS, VOL.33, NO.3, MARCH 2012) by E. Bahat-Treidel et al., referring to FIG. 1, an anode 11 of a Schottky diode is designed as a structure of a groove plus a field plate. The medium under the field plate is a silicon nitride layer 12, metal in the groove of the anode 11 is directly in contact with two-dimensional electron gas 13. In this structure, the reverse voltage performance of the Schottky diode can be improved due to the field plate and an increased distance between the anode and a cathode.

Referring to FIG. 2, a Schottky diode comprising an anode 21 having two layers of composite dielectric layers is proposed in U.S. Pat. No. 8,772,842 B2 entitled "Semiconductor Diodes With Low Reverse Bias Currents" by Yuvaraj Dora et al. In this structure, the two layers of composite dielectric layers include a layer 21 designed as a field plate with a stepped shape and the other layer 23 as a passivation layer, which reduces a peak electric field intensity and increases a breakdown voltage.

Referring to FIG. 3, a Schottky diode with a structure having multiple steps is proposed in U.S. Pat. No. 7,898,004 B2 entitled "Semiconductor Heterostructure Diodes" by Yifeng Wu et al. In this structure, a single dielectric layer is used to form an anode 31 having a stepped field plate structure to reduce a peak electric field intensity. Metal in a bottom portion of a groove of the anode 31 forms a Schottky contact with semiconductor material 32, so as to form an anode structure.

In the above-mentioned technical solutions, field plates are added. Under an applied reverse bias voltage, a field plate can reduce a reverse leakage current of a Schottky diode by reducing an electric field intensity at a Schottky junction, and improves a breakdown voltage under a turn-off state of the Schottky diode. In practice, however, due to the presence of a passivation dielectric layer under the field plate, a reverse bias voltage applied to an anode will be fully applied to the reverse bias Schottky junction before depleting two-dimensional electron gas in a channel under the anode. In order to achieve an ideal passivation effect and a more optimized electric field mitigation effect by the field plate, the passivation dielectric layer usually has a thickness of about 100 nm, which is relatively large compared to an aluminum gallium nitride barrier layer which usually has a thickness of about 20 nm. In addition, currently silicon nitride which has a relatively small dielectric constant compared to aluminum gallium nitrogen is usually used to form the passivation dielectric layer, a relatively high voltage is required to deplete the two-dimensional electron gas. That is, before the two-dimensional electron gas is depleted and the field plate plays a role in mitigating the electric field, the Schottky junction has undergone a high reverse bias voltage. In this case, the field-induced thermionic emission and the tunneling effect both result in an increased reverse leakage current, thus the reverse leakage current is still at a relatively high level.

Therefore, it is required to further reduce the leakage current under a reserve bias state of the gallium nitride Schottky diode and improve the reverse voltage performance thereof.

SUMMARY

In view of this, embodiments of the present invention are directed to a Schottky diode which is capable of reducing a reverse leakage current and improving a reverse voltage performance. Embodiments of the present invention are also directed to a method of manufacturing such a Schottky diode.

According to one or more embodiments of the present invention, there is provided a Schottky diode, comprising: a substrate; a first semiconductor layer located on the substrate; a second semiconductor layer located on the first semiconductor layer, two-dimensional electron gas being formed at an interface between the first semiconductor layer and the second semiconductor layer; a cathode located on the second semiconductor layer and forming an ohmic contact with the second semiconductor layer; a first passivation dielectric layer located on the second semiconductor layer; a field plate groove formed in the first passivation dielectric layer; and an anode covering the field plate groove and a portion of the first passivation dielectric layer, wherein a distance between a bottom surface of the field plate groove and the two-dimensional electron gas in a height direction is greater than 5 nm.

In an embodiment, the Schottky diode further comprises an anode groove formed in the first passivation dielectric layer and the second semiconductor layer. The field plate groove is located between the anode groove and the cathode, the anode covers the anode groove and a portion of the first passivation dielectric layer between the anode groove and the field plate groove.

In an embodiment, a bottom surface of the anode groove extends to or passes through a region where the two-dimensional electron gas is formed. A cross-sectional shape of a side surface of the anode groove is any of a straight line, a fold line and an arc or any combination thereof. An angle between the side surface and a bottom surface of the anode groove is one of a right angle, an obtuse angle and an acute angle.

In an embodiment, a bottom surface of the field plate groove is located within the first passivation dielectric layer, or extends to or passes through an upper surface of the second semiconductor layer.

In an embodiment, the Schottky diode further comprises a field plate groove dielectric layer located on the first passivation dielectric layer and the field plate groove.

In an embodiment, the anode extends to the cathode from the field plate groove a distance which is less than a distance between the field plate groove and the cathode.

In an embodiment, the Schottky diode further comprises: a second passivation dielectric layer deposited on the anode; and a second anode field plate deposited on the second passivation dielectric layer. The second anode field plate is electrically connected to the anode.

In an embodiment, the Schottky diode further comprises: a third passivation dielectric layer deposited on the second anode field plate; and a third anode field plate deposited on the third passivation dielectric layer. The third anode field plate is electrically connected to the anode.

In an embodiment, the second semiconductor layer comprises a first barrier layer and a second barrier layer. A blocking layer is further deposited between the first barrier layer and the second barrier layer. The blocking layer is formed of aluminum nitride. The first barrier layer and the second barrier layer are formed of aluminum gallium nitride. The first barrier layer has an aluminum composition of 10%-15% and a thickness of 5-15 nm. The second barrier layer has an aluminum composition of 20%-45% and a thickness of 15-50 nm.

In an embodiment, a cross-sectional shape of a side surface of the field plate groove is any of a straight line, a fold line and an arc or any combination thereof. An angle between the side surface and a bottom surface of the field plate groove is one of a right angle, an obtuse angle and an acute angle.

In an embodiment, the Schottky diode further comprises at least one of a nucleation layer, a buffer layer and a back-barrier layer between the substrate and the first semiconductor layer.

According to one or more embodiments of the present invention, there is provided a method of manufacturing a Schottky diode, comprising: depositing a first semiconductor layer, a second semiconductor layer and a first passivation dielectric layer sequentially on a substrate, two-dimensional electron gas being formed at an interface between the first semiconductor layer and the second semiconductor layer; forming a cathode on the second semiconductor layer, the cathode forming an ohmic contact with the second semiconductor layer; forming a field plate groove in the first passivation dielectric layer; and forming an anode covering the field plate groove and a portion of the first passivation dielectric layer, wherein a distance between a bottom surface of the field plate groove and the two-dimensional electron gas in a height direction is greater than 5 nm.

In an embodiment, the method further comprises forming an anode groove in the first passivation dielectric layer and the second semiconductor layer. The field plate groove is located between the anode groove and the cathode, the anode covers the anode groove and a portion of the first passivation dielectric layer between the anode groove and the field plate groove.

In an embodiment, a bottom surface of the anode groove extends to or passes through a region where the two-dimensional electron gas is formed.

In an embodiment, the anode groove and the field plate groove are formed by a dry etching process and/or a wet etching process.

In an embodiment, a bottom surface of the field plate groove is located within the first passivation dielectric layer, or extends to or passes through an upper surface of the second semiconductor layer.

According to embodiments of the present invention, by forming the field plate groove in the first passivation dielectric layer, a reverse leakage current of a Schottky diode is reduced; meanwhile the advantages of a low knee voltage and a low turn-on resistance are maintained.

BRIEF DESCRIPTION OF DRAWINGS

These and other aspects will become apparent and more readily appreciated from the following description of the embodiments, taken in conjunction with the accompanying drawings in which.

DETAILED DESCRIPTION

Figure 1:
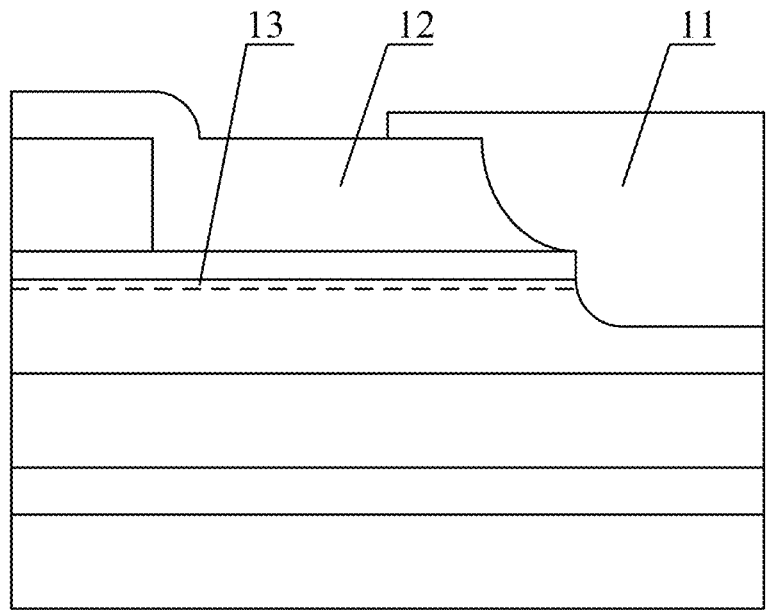
FIGS. 1 to 3 are schematic cross-sectional views of Schottky diodes according to the prior art.
Figure 2:
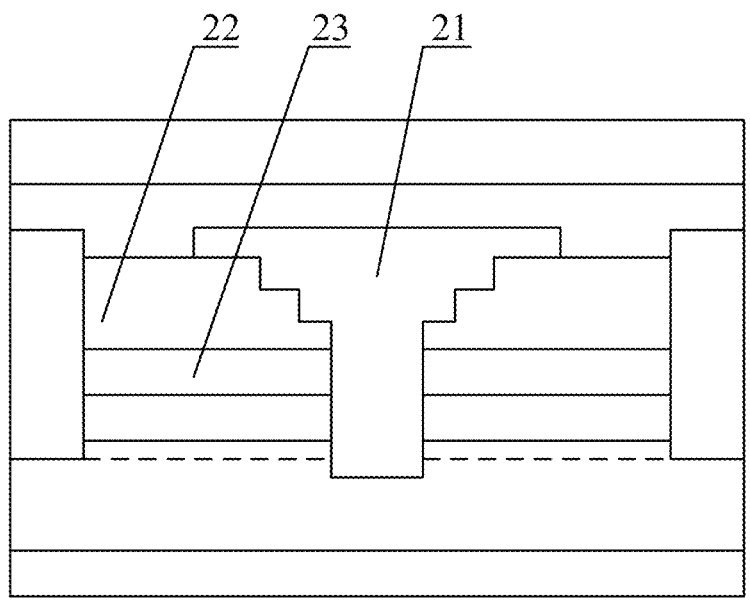
Figure 3:
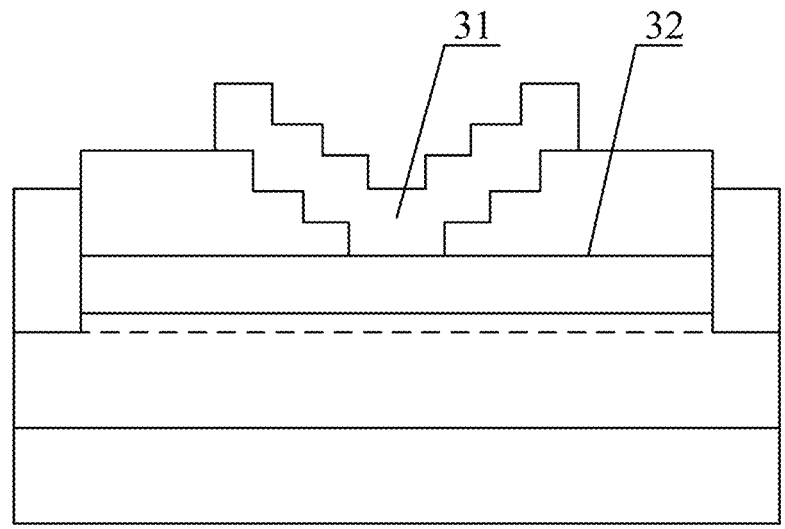

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter embodiments of the present invention will be described in detail with reference to FIGS. 4 to 18.

Figure 4:
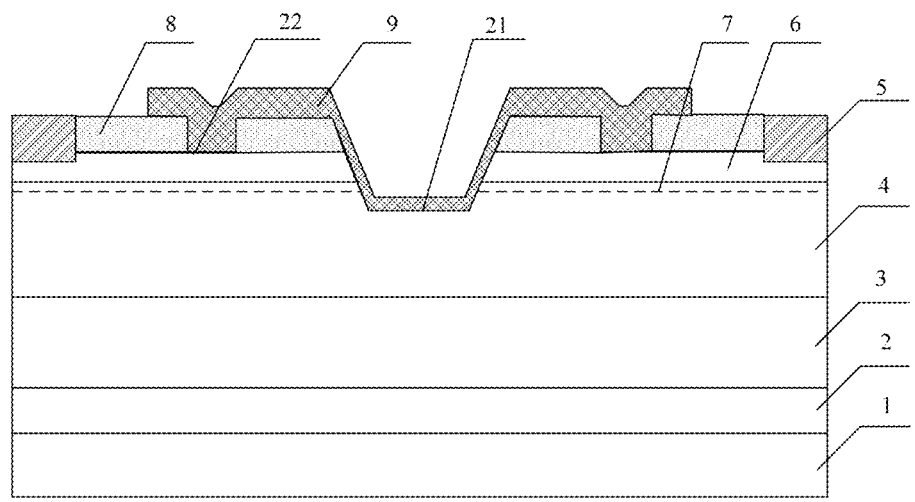
FIG. 4 is a schematic cross-sectional view of a Schottky diode according to a first embodiment of the present invention.

FIG. 4 is a schematic cross-sectional view of a Schottky diode according to a first embodiment of the present invention. As shown in FIG. 4, the Schottky diode according to the first embodiment of the present invention includes a substrate 1 which may be formed of gallium nitride, silicon, sapphire, silicon nitride, aluminum nitride, SOI or other substrate material which is suitable for epitaxially growing III-V nitride.

A nucleation layer 2, a buffer layer 3, a first semiconductor layer 4 and a second semiconductor layer 6 are sequentially grown on the substrate 1. The nucleation layer 2 may be formed of aluminum nitride or gallium nitride. The buffer layer 3 may be formed of a graded layer of aluminum gallium nitride or a super-lattice material. The first semiconductor layer 4 may be formed of gallium nitride. The second semiconductor layer 6 may be formed of aluminum gallium nitride. Two-dimensional electron gas 7 is formed at an interface between the first semiconductor layer 4 and the second semiconductor layer 6. In addition, the first semiconductor layer 4 has a bandgap width smaller than that of the second semiconductor layer 6.

Two cathodes 5 are formed on the second semiconductor layer 6. The cathodes 5 are formed of metal, and form ohmic contacts with the second semiconductor layer 6 respectively. It is noted that only one cathode is labeled as 5 in FIG. 4, and the other one is located at the upper left corner of FIG. 4. In addition, it is noted that the number of the cathodes 5 is not limited thereto. For example, there may be only one cathode, like the eleventh embodiment which will be described later with reference to FIG. 17.

A first passivation dielectric layer 8 is formed, e.g., deposited, on the second semiconductor layer 6 and between the cathodes 5. The first passivation layer 8 typically uses a silicon nitride dielectric layer of about 100 nm. The first passivation dielectric layer 8 serves as suppressing the current collapse effect caused by the surface state of aluminum gallium nitride. The first passivation dielectric layer 8 may be formed of any of silicon nitride, silicon dioxide, silicon oxynitride, fluoride and alumina or any combination thereof.

An anode groove 21 is formed in the first passivation dielectric layer 8 and the second semiconductor layer 6 and is located between the cathodes 5. Two field plate grooves 22 are formed in the first passivation dielectric layer 8 and are located between the anode groove 21 and respective one of the cathodes 5. It is noted that only one field plate groove is labeled as 22 in FIG. 4, and the other one is located on the other side with respect to the anode groove 21. In addition, it is noted that the number of the field plate grooves 22 is not limited thereto. For example, there may be only one field plate groove, like the eleventh embodiment which will be described later with reference to FIG. 17.

The anode groove 21 and/or the field plate grooves 22 can be manufactured by a dry etching process in which different etching speeds are applied in the longitudinal direction and the transverse direction to obtain differently shaped groove structures. Alternatively, the anode groove 21 and/or the field plate grooves 22 can be manufactured by a wet etching process or other processes. Side surfaces of the anode groove 21 and a bottom surface thereof may form right angles, obtuse angles or acute angles or any combination thereof. Similarly, side surfaces of any one of the field plate grooves 22 and a bottom surface thereof may form right angles, obtuse angles or acute angles or any combination thereof. The specific sizes of the grooves may be determined based on design requirements. The bottom surface of the anode groove 21 may reach or pass through the two-dimensional electron gas 7 and extend into the first semiconductor layer 4. The bottom surfaces of the field plate grooves 22 may reach or exceed an upper surface of the second semiconductor layer 6 and extend into the second semiconductor layer 6.

An anode 9 is formed to cover the field plate grooves 22 and a portion of the first passivation dielectric layer 8. For example, referring to FIG. 4, the anode 9 is formed on the anode groove 21, the field plate grooves 22, portions of the first passivation dielectric layer 8 between the anode groove 21 and the field plate grooves 22. In addition, the anode 9 also cover portions of the first passivation dielectric layer 8 extending to but not reaching the cathodes 5 from the field plate grooves 22. In other words, one end of the anode 9 extends to an adjacent cathode 5 from an adjacent field plate groove 22 a distance which is less than a distance between the field plate groove 22 and the cathode 5. The anode 9 forms Schottky contacts with the second semiconductor layer 6, the two-dimensional electron gas 7 and the first semiconductor layer 4.

Due to the field plate grooves 22, the field plate metal is close to the two-dimensional electron gas 7. Therefore, even under a relatively low anode reverse bias voltage, the two-dimensional electron gas 7 under the field plate grooves 22 can be depleted, so as to block current paths between the Schottky junction and the cathodes 5. Accordingly, the reverse bias voltage withstood by the Schottky junction formed by the metal/two-dimensional electron gas is greatly reduced, and the reverse leakage current caused by the field-induced thermionic emission or the tunneling effect is reduced. In this way, the effect of reduction of leakage current can be achieved.

In addition, since the anode metal in the anode groove 21 directly contacts the two-dimensional electron gas 7, a barrier height and a barrier width of the Schottky junction can be reduced, thereby decreasing the forward turn-on voltage of the diode.

In practical applications, electrical characteristic parameters, such as forward knee voltage, turn-on resistance, reverse breakdown voltage threshold and reverse leakage current, will affect the operation of the Schottky diodes. In order to have a good application effect, it is required that the Schottky diodes have the characteristics of a low forward knee voltage, a low turn-on resistance, a high reverse breakdown voltage threshold and a low reverse leakage current.

Figure 5A:
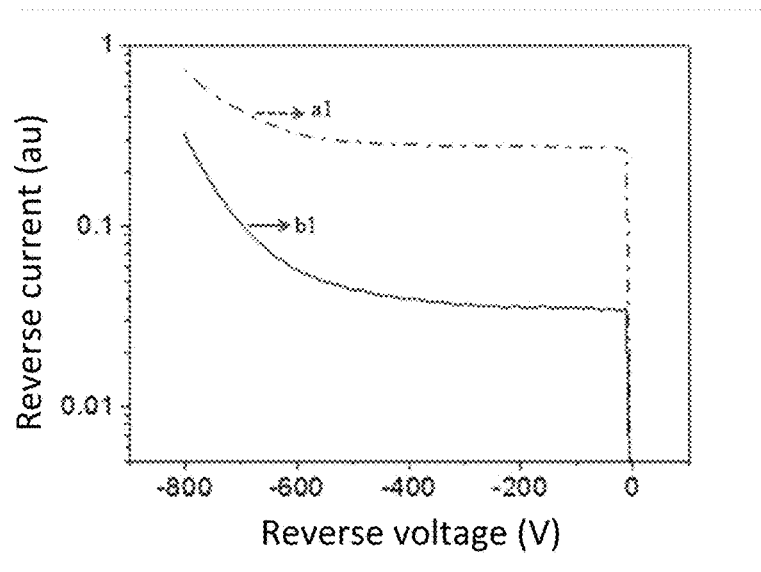
FIGS. 5A and 5B are graphs illustrating the electrical characteristics of the Schottky diode according to the prior art shown in FIG. 1 and that of the Schottky diode according to the first embodiment of the present invention.

FIG. 5A is a graph illustrating the reverse electrical characteristics of the Schottky diode according to the prior art shown in FIG. 1 with that of the Schottky diode according to the first embodiment of the present invention.

In FIG. 5A, a dashed line a1 represents the reverse electrical characteristic of the Schottky diode according to the prior art, while a solid line b1 represents the reverse electrical characteristic of the Schottky diode according to the first embodiment of the present invention, where au, an abbreviation of absolute unit, is used as the unit of current represented by the vertical axis. It can be seen from FIG. 5A that a reverse bias current of the Schottky diode according to the first embodiment of the present invention is significantly lower than that of the Schottky diode according to the prior art under a same reverse bias voltage condition. If the reverse voltage performance of the diode is defined by a same leakage current level, it can be seen that the reverse voltage performance of the Schottky diode having the field plate grooves proposed by the present invention is remarkably improved.

Figure 5B:
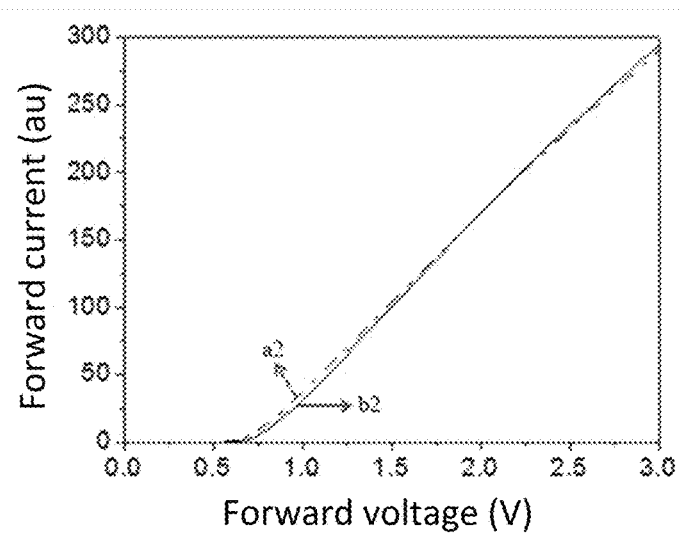

FIG. 5B is a graph illustrating the forward electrical characteristics of the Schottky diode according to the prior art shown in FIG. 1 with that of the Schottky diode according to the first embodiment of the present invention.

In FIG. 5B, a dashed line a2 represents the forward electrical characteristic of the Schottky diode according to the prior art, while a solid line b2 represents the forward electrical characteristic of the Schottky diode according to the first embodiment of the present invention, where au, an abbreviation of absolute unit, is used as the unit of current represented by the vertical axis. It can be seen from FIG. 5B that the relationship between a forward voltage and a forward current of the Schottky diode according to the first embodiment of the present invention is substantially same as that of the Schottky diode according to the prior art. That is, the field plate grooves have little impact on the forward electrical characteristics of the Schottky diode.

According to the comparison of the above-mentioned electrical characteristics, it is proved that the Schottky diode according to the first embodiment of the present invention has the advantage of a low reverse leakage current, meanwhile maintains the advantages of a low knee voltage and a low turn-on resistance.

Figure 6A:
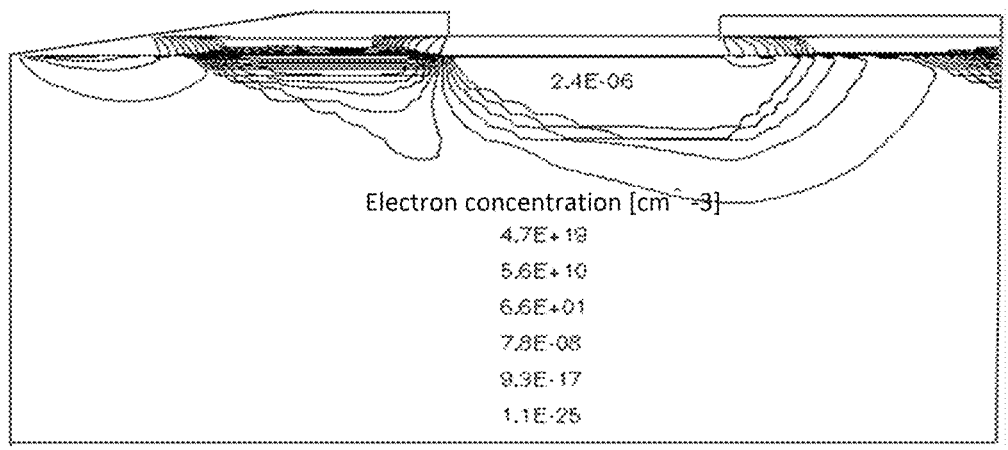
FIGS. 6A and 6B are graphs illustrating the electron concentration distribution of the Schottky diode according to the first embodiment of the present invention and that of the Schottky diode according to the prior art shown in FIG. 1, respectively, when a same reverse bias voltage is applied to the anodes.
Figure 6B:
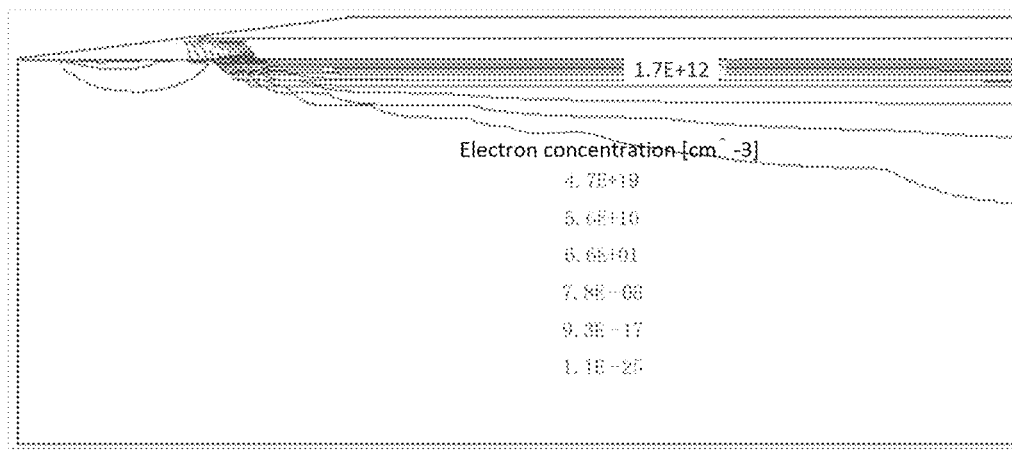

FIGS. 6A and 6B are graphs illustrating the electron concentration distribution of the Schottky diode according to the first embodiment of the present invention and that of the Schottky diode according to the prior art shown in FIG. 1, respectively, when a same reverse bias voltage of −20 V is applied to the anodes.

It can be seen from FIGS. 6A and 6B that, when a same reverse bias voltage of −20 V is applied to the anodes, the electrons in channel regions under the field plate grooves of the Schottky diode according to the first embodiment of the present invention are substantially completely depleted and the two-dimensional electron gas concentration is just $2.4 \times 10^{-6}/cm^3$, while the electrons in channel regions under the anode field plate of the Schottky diode according to the prior art are not completely depleted and the two-dimensional electron gas concentration is as high as $1.7 \times 10^{12}/cm^3$.

Figure 7A:
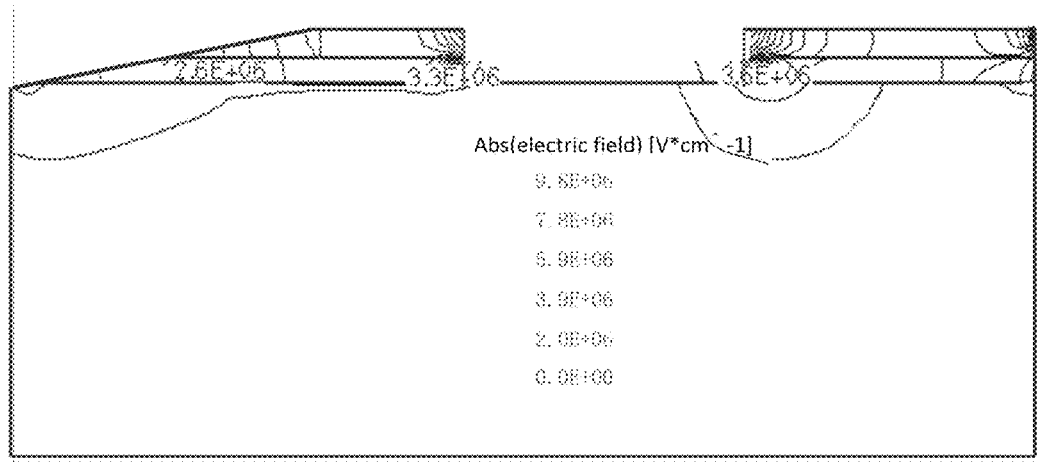
FIGS. 7A and 7B are graphs illustrating the electric field distribution of the Schottky diode according to the first embodiment of the present invention and that of the Schottky diode according to the prior art shown in FIG. 1, respectively, when a same reverse bias voltage is applied to the anodes.
Figure 7B:
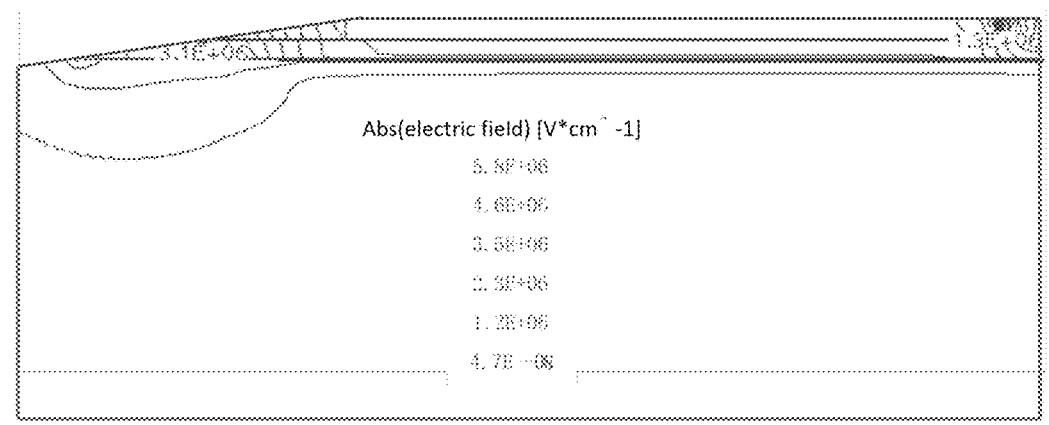

FIGS. 7A and 7B are graphs illustrating the electric field distribution of the Schottky diode according to the first embodiment of the present invention and that of the Schottky diode according to the prior art shown in FIG. 1, respectively, when a same reverse bias voltage is applied to the anodes.

It can be seen from FIGS. 7A and 7B, when a same reverse bias voltage is applied to the anodes, the electric field intensity at side surfaces of the anode groove of the Schottky diode according to the prior art is $3.1 \times 10^6$ V/cm, while the electric field intensity at side surfaces of the anode groove of the Schottky diode according to the first embodiment of the present invention is $2.6 \times 10^6$ V/cm, which is about 83% of that in the prior art. In the Schottky junction, the reverse leakage current caused by field-induced thermionic emission or the tunneling effect has an exponential correlation with the electric field intensity. Therefore, the reverse leakage current can be effectively reduced in the first embodiment of the present invention.

Through comparison of the channel electron concentration shown in FIGS. 6A and 6B and comparison of the electric field intensity shown in FIGS. 7A and 7B, it is further proved that in the anode structure of the Schottky diode according to the first embodiment of the present invention, the two-dimensional electron gas in channel regions under the field plate grooves can be depleted even under a low reverse bias voltage, so that the electric field intensity withstood by the Schottky junction formed by metal/two-dimensional electron gas is reduced.

Figure 8:
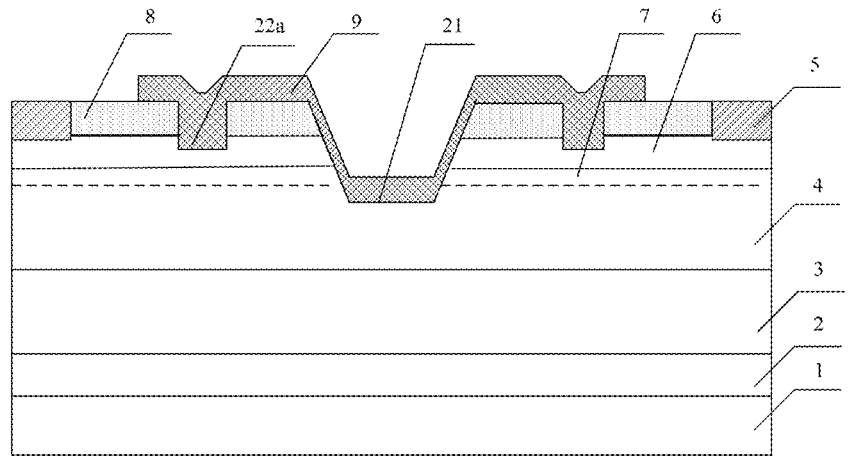
FIG. 8 is a schematic cross-sectional view of a Schottky diode according to a second embodiment of the present invention.

FIG. 8 is a schematic cross-sectional view of a Schottky diode according to a second embodiment of the present invention. The duplicated description on the same or similar elements as those in the first embodiment will not be repeated.

As shown in FIG. 8, different from the first embodiment, two field plate grooves 22a of the Schottky diode according to the second embodiment extend into, but not beyond, the second semiconductor layer 6. A distance between a bottom surface of any one of the field plate groves 22a and the two-dimensional electron gas 7 in a height direction should be greater than 5 nm to ensure a concentration sufficient for the two-dimensional electron gas 7 to operate normally. In contrast, if the above-mentioned distance is less than 5 nm, it is possible that the two-dimensional electron gas 7 will be depleted completely, which will increase the forward turn-on voltage of the diode.

Compared with the Schottky diode according to the first embodiment of the present invention, the field plate metal of the Schottky diode according to the second embodiment is closer to the two-dimensional electron gas 7. Therefore, the two-dimensional electron gas 7 under the field plate grooves 22a can be depleted under a lower anode reverse bias voltage. Accordingly, the reverse bias voltage withstood by the Schottky junction formed by the metal/two-dimensional electron gas is further reduced, and the reverse leakage current of the Schottky junction is further reduced.

Figure 9:
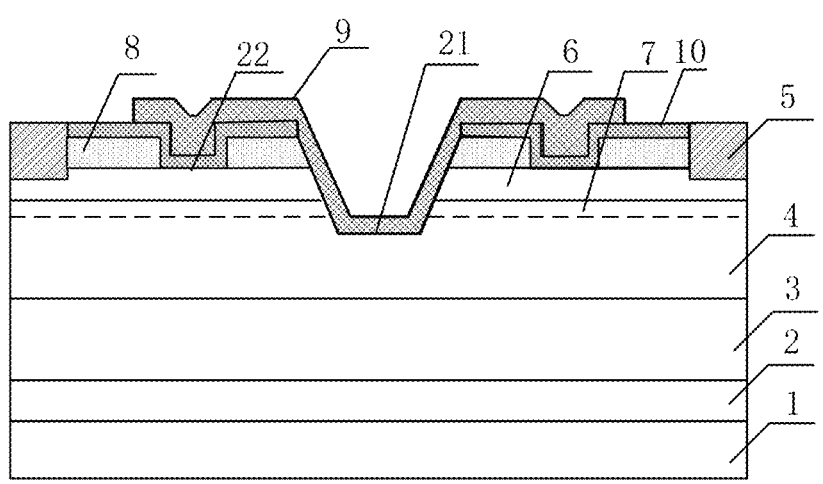
FIG. 9 is a schematic cross-sectional view of a Schottky diode according to a third embodiment of the present invention.

FIG. 9 is a schematic cross-sectional view of a Schottky diode according to a third embodiment of the present invention. The duplicated description on the same or similar elements as those in the first embodiment will not be repeated.

As shown in FIG. 9, different from the first embodiment, the Schottky diode according to the third embodiment of the present invention further comprises a field plate groove dielectric layer 10 located on the passivation dielectric layer 8 and the field plate grooves 22.

In this embodiment, the field plate groove dielectric layer 10 may be formed of any one of silicon nitride, silicon dioxide, silicon oxynitride and aluminum oxide or any combination thereof.

Compared with the Schottky diode according to the first embodiment of the present invention, the field plate groove dielectric layer 10 is further included between the field plate grooves 22 and the anode 9. Therefore, at a reverse bias voltage, the leakage current flowing through the Schottky junction with the field plate groove structure can be further reduced.

Figure 10:
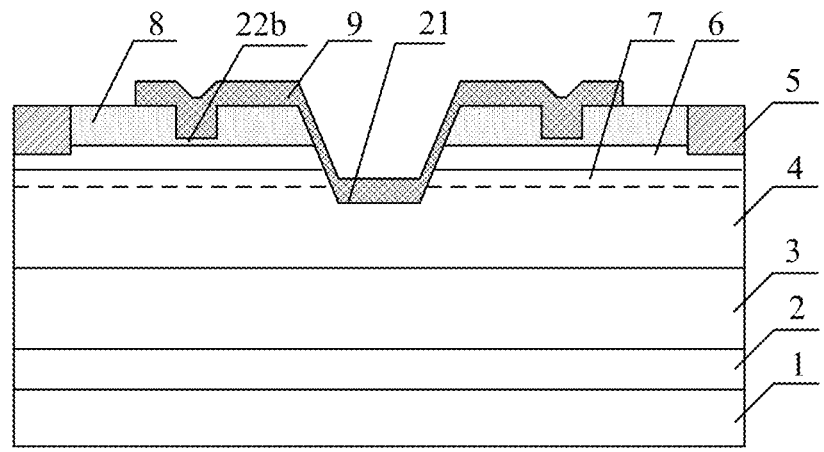
FIG. 10 is a schematic cross-sectional view of a Schottky diode according to a fourth embodiment of the present invention.

FIG. 10 is a schematic cross-sectional view of a Schottky diode according to a fourth embodiment of the present invention. The duplicated description on the same or similar elements as those in the first embodiment will not be repeated.

As shown in FIG. 10, different from the first embodiment, the passivation dielectric layer 8 is not etched completely when field plate grooves 22b are formed, so that the remained part of the passivation dielectric layer 8 in the height direction forms a field plate groove layer. This can be realized by utilizing dry etching process and controlling the etching time. Therefore, the field plate grooves 22b have fewer depths compared with the field plate grooves 22 of the Schottky diode according to the first embodiment. That is, a bottom surface of any of the field plate grooves 22b does not reach the second semiconductor layer 6, instead it is located inside the first passivation dielectric layer 8.

Compared with the Schottky diode according to the third embodiment of the present invention, in this embodiment, the process of depositing dielectric materials for the field plate grooves 22b is simplified.

Figure 11:
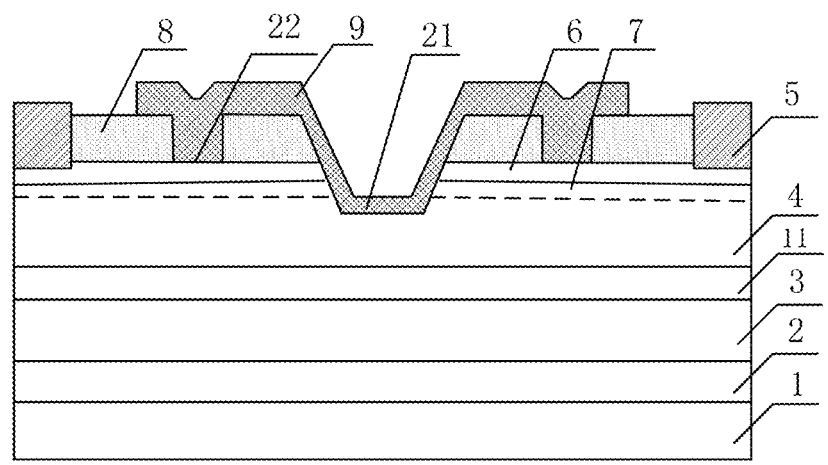
FIG. 11 is a schematic cross-sectional view of a Schottky diode according to a fifth embodiment of the present invention.

FIG. 11 is a schematic cross-sectional view of a Schottky diode according to a fifth embodiment of the present invention. The duplicated description on the same or similar elements as those in the first embodiment will not be repeated.

As shown in FIG. 11, different from the first embodiment, in the Schottky diode according to the fifth embodiment of the present invention, a back-barrier layer 11 is inserted under the first semiconductor layer 4.

The back-barrier layer 11 may be formed of aluminum gallium nitride with an aluminum composition of 5%-15%. And the aluminum composition of the back-barrier layer 11 is lower than that of the second semiconductor layer 6.

Since aluminum gallium nitride has a larger bandgap width than gallium nitride, the introduction of the back-barrier layer 11 can provide a better restriction on the two-dimensional electron gas channel in the first semiconductor layer 4. Under application of an external reverse bias voltage, electrons will be leaked to the cathodes 5 from the anode 9 through the buffer layer 3, thereby increasing the reverse leakage current of the Schottky diode. The introduction of the aluminum gallium nitride back-barrier layer 11 with low aluminum composition will hinder the electrons to enter the buffer layer 3, so as to reduce the reverse leakage current leaked through the buffer layer 3.

Compared with the Schottky diode according to the first embodiment of the present invention, in this embodiment, the back-barrier layer 11 with low aluminum composition is further included, thus the reverse leakage current flowing through the buffer layer 3 is reduced.

Figure 12:
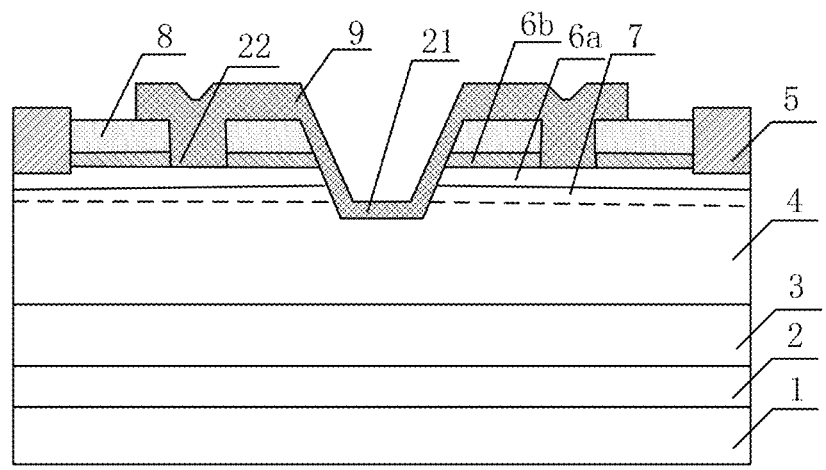
FIG. 12 is a schematic cross-sectional view of a Schottky diode according to a sixth embodiment of the present invention.

FIG. 12 is a schematic cross-sectional view of a Schottky diode according to a sixth embodiment of the present invention. The duplicated description on the same or similar elements as those in the first embodiment will not be repeated.

As shown in FIG. 12, different from the first embodiment, a second semiconductor layer of the Schottky diode according to this embodiment comprises a first barrier layer 6a and a second barrier layer 6b.

The first barrier layer 6a may be formed of aluminum gallium nitride with an aluminum composition of 10%-15%, and have a thickness of 5-15 nm. The second barrier layer 6b may be formed of aluminum gallium nitride and have a thickness of 15-50 nm. The second barrier layer 6b has an aluminum composition of 25%-45% which is higher than that of the first barrier layer 6a.

The field plate grooves 22 are formed in the first passivation dielectric layer 8 and the second barrier layer 6b having a high aluminum composition by the field plate groove etching process. The bottom surfaces of the field plate grooves 22 may reach or pass through an upper surface of the first barrier layer 6a. Since portions of the first barrier layer 6a under the field plate grooves 22 have low aluminum concentrations and small thicknesses, the two-dimensional electron gas 7 under the field plate grooves 22 has lower concentration compared with the first embodiment, and is easier to be depleted when the anode is applied with a negative bias voltage. Accordingly, the reverse bias voltage withstood by the Schottky junction formed by the metal/two-dimensional electron gas is further reduced, and the reverse leakage current caused by the field-induced thermionic emission or the tunneling effect is further reduced.

In addition, portions of the second barrier layer 6b between the field plate grooves 22 and the cathodes 5 have high aluminum composition, which makes the two-dimensional electron gas 7 thereunder have a relatively high concentration, thereby allowing the Schottky diode according to this embodiment to have a relatively low turn-on resistance and reducing the forward turning-on voltage of the diode.

Furthermore, in this embodiment, a back-barrier layer (not shown) may be further inserted under the first semiconductor layer 4 to suppress the reverse leakage current flowing through the buffer layer 3. The back-barrier layer may be formed of aluminum gallium nitrogen. Since the back-barrier layer further depletes the two-dimensional electron gas 7, the turn-on resistance becomes high and the forward turning-on voltage is increased. Therefore, it is necessary to limit the aluminum composition of the aluminum gallium nitrogen of the back-barrier layer to 5%-8%, i.e., less than the aluminum composition of the first barrier layer 6a. In this way, it is ensured that the two-dimensional electron gas 7 under the field plate grooves 22 still has a certain concentration and is not completely depleted, so that the forward turning-on voltage of the Schottky diode remains low.

Figure 13:
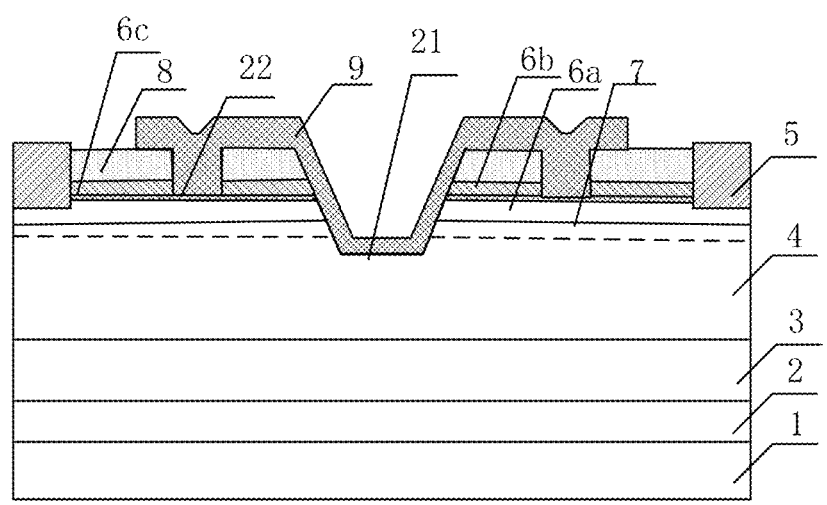
FIG. 13 is a schematic cross-sectional view of a Schottky diode according to a seventh embodiment of the present invention.

FIG. 13 is a schematic cross-sectional view of a Schottky diode according to a seventh embodiment of the present invention. The duplicated description on the same or similar elements as those in the sixth embodiment will not be repeated.

As shown in FIG. 13, different from the sixth embodiment, the Schottky diode according to the seventh embodiment of the present invention further comprises a blocking layer 6c located between the first barrier layer 6a and the second barrier layer 6b. The blocking layer 6c may be formed of aluminum nitride.

Compared with the Schottky diode according to the sixth embodiment of the present invention, in this embodiment, the blocking layer 6c is further inserted between the first barrier layer 6a and the second barrier layer 6b. With the introduction of the aluminum nitride blocking layer, an etching selection ratio between aluminum nitride and aluminum gallium nitride is relatively large during dry etching, so that surfaces of the grooves can be stopped at exact positions during the etching process, which improves the uniformity of the knee voltage of the Schottky diode.

Figure 14:
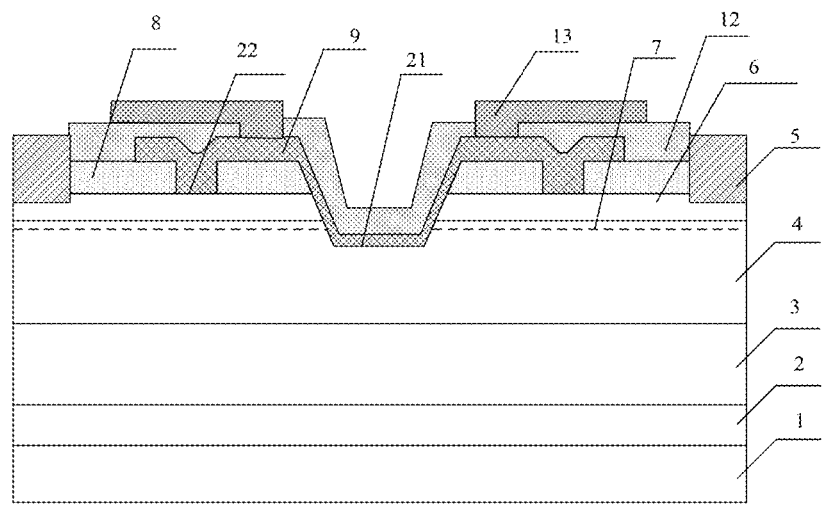
FIG. 14 is a schematic cross-sectional view of a Schottky diode according to an eighth embodiment of the present invention.

FIG. 14 is a schematic cross-sectional view of a Schottky diode according to an eighth embodiment of the present invention. The duplicated description on the same or similar elements as those in the first embodiment will not be repeated.

As shown in FIG. 14, different from the first embodiment, the Schottky diode according to the eighth embodiment of the present invention further comprises a second passivation dielectric layer 12 deposited on the anode 9 and a second anode field plate 13 deposited on the second passivation dielectric layer 12. The second anode field plate 13 is interconnected with the anode 9.

In this embodiment, the second passivation dielectric layer 12 may be formed of any of silicon nitride, silicon dioxide, silicon oxynitride and aluminum oxide or any combination thereof.

Compared with the Schottky diode according to the first embodiment of the present invention, in this embodiment, the second passivation dielectric layer 12 is deposited on the anode 9, and the second anode field plate 13 which is interconnected with the anode 9 is deposited on the second passivation dielectric layer 12. With the addition of the second anode field plate 13, a peak electric field at edges of the anode 9 between the anode 9 and the cathodes 5 is further reduced, and reverse voltage performance of the diode is improved.

Figure 15:
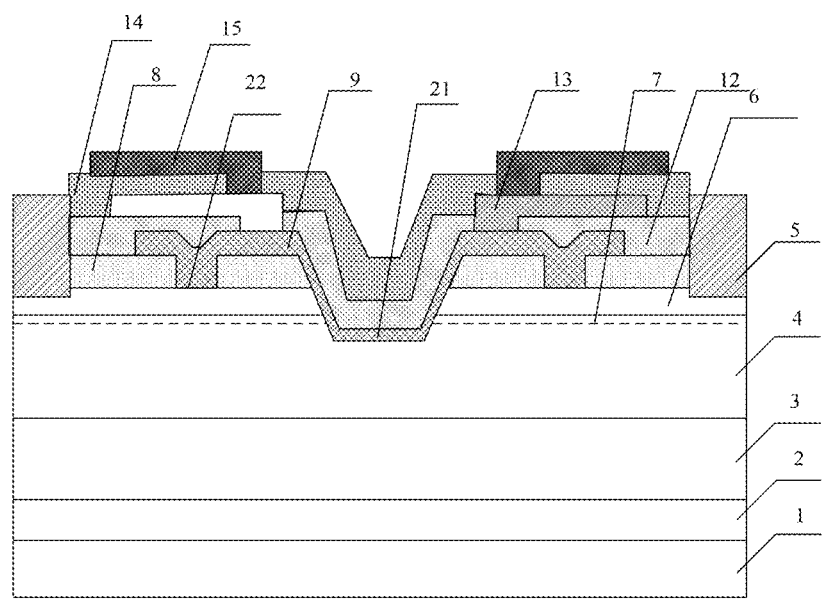
FIG. 15 is a schematic cross-sectional view of a Schottky diode according to a ninth embodiment of the present invention.

FIG. 15 is a schematic cross-sectional view of a Schottky diode according to a ninth embodiment of the present invention. The duplicated description on the same or similar elements as those in the eighth embodiment will not be repeated.

As shown in FIG. 15, different from the eighth embodiment, the Schottky diode according to the ninth embodiment of the present invention further comprises a third passivation dielectric layer 14 deposited on the second passivation dielectric layer 12 and the second anode field plate 13, as well as a third anode field plate 15 deposited on the third passivation dielectric layer 14. The third anode field plate 15 is interconnected with the anode 9 and the second anode field plate 13.

In this embodiment, the third passivation dielectric layer 14 may be formed of any of silicon nitride, silicon dioxide, silicon oxynitride and aluminum oxide or any combination thereof.

Compared with the Schottky diode according to the eighth embodiment of the present invention, in this embodiment, the third passivation dielectric layer 14 and the third anode field plate 15 are deposited on the second passivation dielectric layer 12 and the second anode field plate 13, and the third anode field plate 13 is interconnected with the anode 9. With the addition of the third anode field plate 15, the peak electric field at the edges of the anode 9 between the anode 9 and the cathodes 5 is further reduced, and reverse voltage performance of the diode is further improved.

Figure 16:
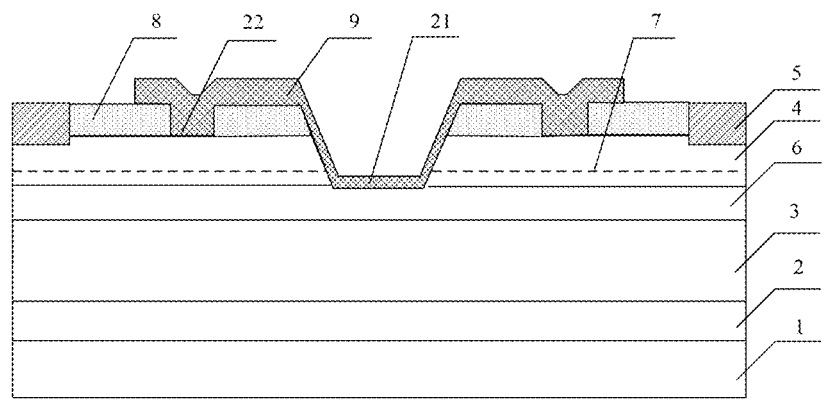
FIG. 16 is a schematic cross-sectional view of a Schottky diode according to a tenth embodiment of the present invention.

FIG. 16 is a schematic cross-sectional view of a Schottky diode according to a tenth embodiment of the present invention. The duplicated description on the same or similar elements as those in the first embodiment will not be repeated.

As shown in FIG. 16, different from the first embodiment, in the Schottky diode according to the tenth embodiment of the present invention, the first semiconductor layer 4 is deposited on an upper surface of the second semiconductor layer 6, the cathodes 5 and surfaces of the first semiconductor layer 4 form ohmic contacts, and the anode 9 and the surfaces of the first semiconductor layer 4 form a Schottky contact.

Since the first semiconductor layer 4 has a bandgap width smaller than that of the second semiconductor layer 6, the first semiconductor layer 4 and the cathodes 5 are more likely to form ohmic contacts. Similar to the Schottky diode according to the first embodiment of the present invention, in this embodiment, electrical characteristics of low reverse leakage current and low forward knee voltage can be realized as well.

Figure 17:
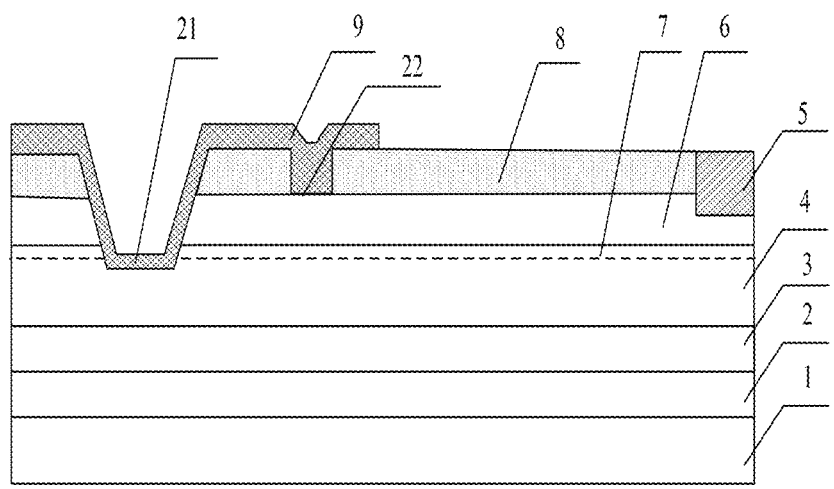
FIG. 17 is a schematic cross-sectional view of a Schottky diode according to an eleventh embodiment of the present invention.

FIG. 17 is a schematic cross-sectional view of a Schottky diode according to an eleventh embodiment of the present invention. The duplicated description on the same or similar elements as those in the first embodiment will not be repeated.

As shown in FIG. 17, different from the first embodiment, in the Schottky diode according to the eleventh embodiment of the present invention, there is only one cathode 5 and one field plate groove 22.

Similar to the Schottky diode according to the first embodiment of the present invention, in this embodiment, electrical characteristics of low reverse leakage current and low forward knee voltage can be realized as well. Furthermore, the manufacturing process of the diode is more simple compared with that according to the first embodiment.

Figure 18:
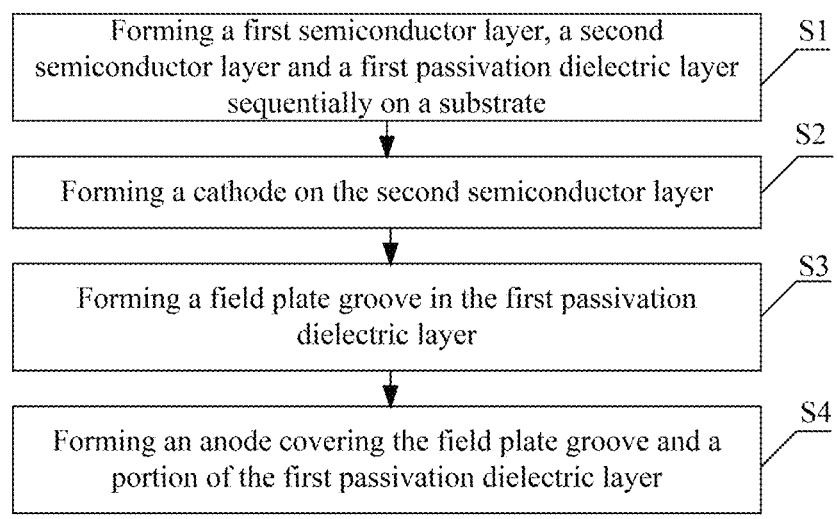
FIG. 18 is a flowchart of a method for manufacturing a Schottky diode according to an embodiment of the present invention.

FIG. 18 is a flowchart of a method for manufacturing a Schottky diode according to an embodiment of the present invention. As shown in FIG. 18, the method comprises the following steps:

Step S1: forming, e.g. depositing, a first semiconductor layer, a second semiconductor layer and a first passivation dielectric layer sequentially on a substrate, two-dimensional electron gas being formed at an interface between the first semiconductor layer and the second semiconductor layer;

Step S2: forming a cathode on the second semiconductor layer, the cathode forming an ohmic contact with the second semiconductor layer;

Step S3: forming a field plate groove in the first passivation dielectric layer; and Step S4: forming an anode covering the field plate groove and a portion of the first passivation dielectric layer.

The method may further comprise forming an anode groove in the first passivation dielectric layer and the second semiconductor layer. In this case, the field plate groove is located between the anode groove and the cathode, the anode covers the anode groove and a portion of the first passivation dielectric layer between the anode groove and the field plate groove. A bottom surface of the anode groove extends to or passes through a region where the two-dimensional electron gas is formed. A bottom surface of the field plate groove is located within the first passivation dielectric layer, or extends to or passes through an upper surface of the second semiconductor layer.

Furthermore, the anode groove and/or the field plate groove can be formed by a dry etching process and/or a wet etching process.

It will be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A Schottky diode, comprising:
   a substrate;
   a first semiconductor layer located on the substrate;
   a second semiconductor layer located on the first semiconductor layer, two-dimensional electron gas being formed at an interface between the first semiconductor layer and the second semiconductor layer;
   a cathode located on the second semiconductor layer and forming an ohmic contact with the second semiconductor layer;
   a first passivation dielectric layer located on the second semiconductor layer;
   a field plate groove formed in the first passivation dielectric layer; and
   an anode covering the field plate groove and a portion of the first passivation dielectric layer,
   wherein a distance between a bottom surface of the field plate groove and the two-dimensional electron gas in a height direction is greater than 5 nm.

2. The Schottky diode of claim 1, further comprising:
   an anode groove formed in the first passivation dielectric layer and the second semiconductor layer,
   wherein the field plate groove is located between the anode groove and the cathode, the anode covers the anode groove and a portion of the first passivation dielectric layer between the anode groove and the field plate groove.

3. The Schottky diode of claim 2, wherein a bottom surface of the anode groove extends to or passes through a region where the two-dimensional electron gas is formed.

4. The Schottky diode of claim 2, wherein a cross-sectional shape of a side surface of the anode groove is any of a straight line, a fold line and an arc or any combination thereof, an angle between the side surface and a bottom surface of the anode groove is one of a right angle, an obtuse angle and an acute angle.

5. The Schottky diode of claim 1, wherein a bottom surface of the field plate groove is located within the first passivation dielectric layer, or extends to or passes through an upper surface of the second semiconductor layer.

6. The Schottky diode of claim 1, further comprising:
   a field plate groove dielectric layer located on the first passivation dielectric layer and the field plate groove.

7. The Schottky diode of claim 1, wherein the anode extends to the cathode from the field plate groove a distance which is less than a distance between the field plate groove and the cathode.

8. The Schottky diode of claim 1, further comprising:
   a second passivation dielectric layer deposited on the anode; and
   a second anode field plate deposited on the second passivation dielectric layer,
   wherein the second anode field plate is electrically connected to the anode.

9. The Schottky diode of claim 8, further comprising:
   a third passivation dielectric layer deposited on the second anode field plate; and
   a third anode field plate deposited on the third passivation dielectric layer,
   wherein the third anode field plate is electrically connected to the anode.

10. The Schottky diode of claim 1, wherein the second semiconductor layer comprises a first barrier layer and a second barrier layer.

11. The Schottky diode of claim 10, further comprising a blocking layer deposited between the first barrier layer and the second barrier layer.

12. The Schottky diode of claim 11, wherein the blocking layer is formed of aluminum nitride.

13. The Schottky diode of claim 10, wherein the first barrier layer and the second barrier layer are formed of aluminum gallium nitride, the first barrier layer has an aluminum composition of 10%-15% and a thickness of 5-15 nm, the second barrier layer has an aluminum composition of 20%-45% and a thickness of 15-50 nm.

14. The Schottky diode of claim 1, wherein a cross-sectional shape of a side surface of the field plate groove is any of a straight line, a fold line and an arc or any combination thereof, an angle between the side surface and a bottom surface of the field plate groove is one of a right angle, an obtuse angle and an acute angle.

15. The Schottky diode of claim 1, further comprising at least one of a nucleation layer, a buffer layer and a back-barrier layer between the substrate and the first semiconductor layer.

16. A method of manufacturing a Schottky diode, comprising:
    forming a first semiconductor layer, a second semiconductor layer and a first passivation dielectric layer sequentially on a substrate, two-dimensional electron gas being formed at an interface between the first semiconductor layer and the second semiconductor layer;
    forming a cathode on the second semiconductor layer, the cathode forming an ohmic contact with the second semiconductor layer;
    forming a field plate groove in the first passivation dielectric layer; and
    forming an anode covering the field plate groove and a portion of the first passivation dielectric layer,
    wherein a distance between a bottom surface of the field plate groove and the two-dimensional electron gas in a height direction is greater than 5 nm.

17. The method of claim 16, further comprising forming an anode groove in the first passivation dielectric layer and the second semiconductor layer,
    wherein the field plate groove is located between the anode groove and the cathode, the anode covers the anode groove and a portion of the first passivation dielectric layer between the anode groove and the field plate groove.

18. The method of claim 17, wherein a bottom surface of the anode groove extends to or passes through a region where the two-dimensional electron gas is formed.

19. The method of claim 17, wherein the anode groove and the field plate groove are formed by a dry etching process and/or a wet etching process.

20. The method of claim 16, wherein a bottom surface of the field plate groove is located within the first passivation dielectric layer, or extends to or passes through an upper surface of the second semiconductor layer.

* * * * *